(12) United States Patent
Leroy et al.

(10) Patent No.: US 12,271,661 B1
(45) Date of Patent: Apr. 8, 2025

(54) LAND USABILITY METRIC GENERATION FOR PHOTOVOLTAIC SYSTEMS

(71) Applicant: BrightNight Power LLC, West Palm Beach, FL (US)

(72) Inventors: Cédric Leroy, Austin, TX (US); Marc Hermann, West Palm Beach, FL (US); Egor Sanin, San Francisco, CA (US)

(73) Assignee: BrightNight Power LLC, West Palm Beach, FL (US)

( * ) Notice: Subject to any disclaimer, the term of this patent is extended or adjusted under 35 U.S.C. 154(b) by 0 days.

(21) Appl. No.: 18/960,689

(22) Filed: Nov. 26, 2024

(51) Int. Cl.
*G06F 30/13* (2020.01)

(52) U.S. Cl.
CPC .................................. *G06F 30/13* (2020.01)

(58) Field of Classification Search
CPC ................................ G06F 30/00; G06F 30/13
USPC ............................................................ 703/1
See application file for complete search history.

(56) References Cited

U.S. PATENT DOCUMENTS

| | | |
|---|---|---|
| 9,934,334 B2 | 4/2018 | Pryor |
| 11,301,790 B1 | 4/2022 | Damia-Levy |
| 2013/0246010 A1 | 9/2013 | Dershowitz et al. |
| 2024/0086934 A1 | 3/2024 | Bloom et al. |

OTHER PUBLICATIONS

Nasrallah, Hasan et al., "Lebanon Solar Rooftop Potential Assessment Using Buildings Segmentation From Aerial Images, Jun. 10, 2022, IEEE Journal of Selected Topics in Applied Earth Observations and Remote Sensing", vol. 15, IEEE. (Year: 2022).*
Hopf, Konstantin et al., "A Decision Support System for Photovoltaic Potential Estimation", Oct. 17-18, 2017, IML, ACM. (Year: 2017).*

* cited by examiner

*Primary Examiner* — Cedric Johnson
(74) *Attorney, Agent, or Firm* — FOLEY & LARDNER LLP

(57) ABSTRACT

A method may include retrieving, from a geographic database, geographic information of a geographic area, segmenting the geographic area into one or more regions, executing a buildability algorithm using as input the geographic information to determine buildable portions of the one or more regions, executing a PV array placement algorithm using as input a total area of the buildable portions of the one or more regions to determine a baseline PV capacity for the one or more regions, executing the PV array placement algorithm using as input the buildable portions of the one or more regions to determine an actual PV capacity for the one or more regions, and generating a data structure to associate the one or more regions with a respective ratio of the baseline PV capacity to the actual PV capacity for each of the one or more regions.

20 Claims, 7 Drawing Sheets

LAND USABILITY METRIC GENERATION FOR PHOTOVOLTAIC SYSTEMS

BACKGROUND

Renewable energy assets, such as photovoltaic (PV) arrays, may be installed in a variety of environments. However, some environmental factors may prevent installation of PV arrays, such as steep slopes and wetlands.

BRIEF DESCRIPTION OF THE DRAWINGS

The accompanying drawings are not intended to be drawn to scale. Like reference numbers and designations in the various drawings indicate like elements. For purposes of clarity, not every component may be labeled in every drawing.

DETAILED DESCRIPTION

Figure 1:
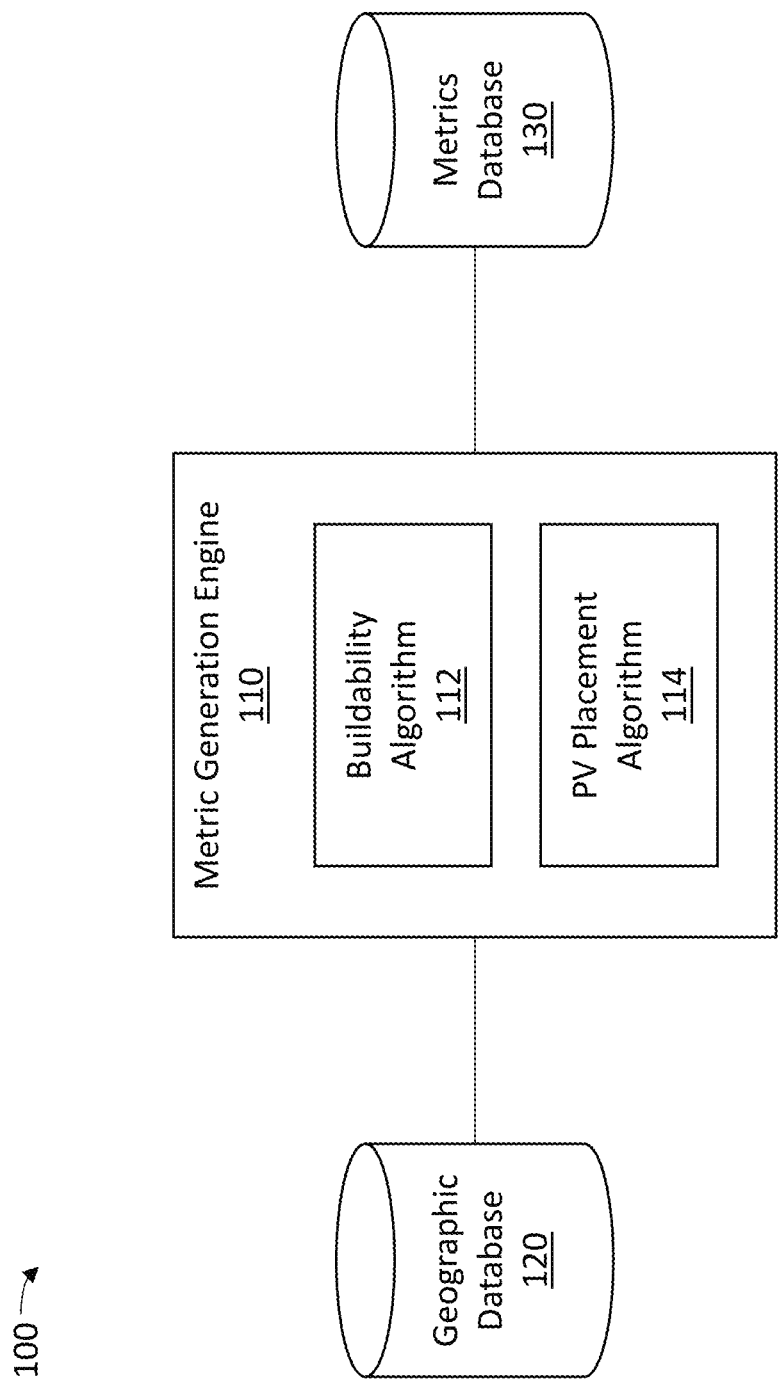
FIG. 1 is a block diagram of an example computing system for generating land usability metrics.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

Buildability metrics can be used in evaluating and selecting sites for renewable energy plants, designing renewable energy plants, and estimating a cost of renewable energy projects. However, buildability metrics alone do not provide an accurate picture of whether a site is suitable for a renewable energy project, resulting in uncertainty in evaluating sites for renewable energy projects. When automatically evaluating and generating metrics for hundreds or thousands of potential sites, uncertainty in metrics, or uncertainty as to project feasibility due to unclear metrics, can cause significant delays in site selection, requiring intensive manual input. Implementations and examples described herein solve the technical problem of uncertainty in automatic evaluation of renewal energy project sites by simulating placement of renewable energy assets within buildable areas. The simulated placement of renewable energy assets can be used to automatically generate land usability metrics that indicate suitability of sites for renewable energy projects. In this way, potential sites can be automatically evaluated in terms of potential power production, providing accurate, relevant metrics for site selection.

FIG. 1 is a block diagram of an example computing system 100 for generating land usability metrics. The system includes a metric generation engine 110. The metric generation engine 110 may generate metrics for potential sites for renewable energy projects for comparison and evaluation of the potential sites. The metric generation engine 110 can retrieve geographic information of a geographic area from a geographic database 120. The geographic database 120 can be a geographic information system (GIS) database. The geographic database 120 can include a plurality of databases, and/or aggregate data from a plurality of databases. The geographic information can include elevation, topography, ownership, soil composition, precipitation, flood risk, lease availability, lease options, and other parameters. In an example, the geographic area includes the western United States, with geographic information for hundreds of thousands of potential sites. In an example, the geographic area includes eastern Kentucky, with geographic information for tens of thousands of potential sites.

Figure 2:
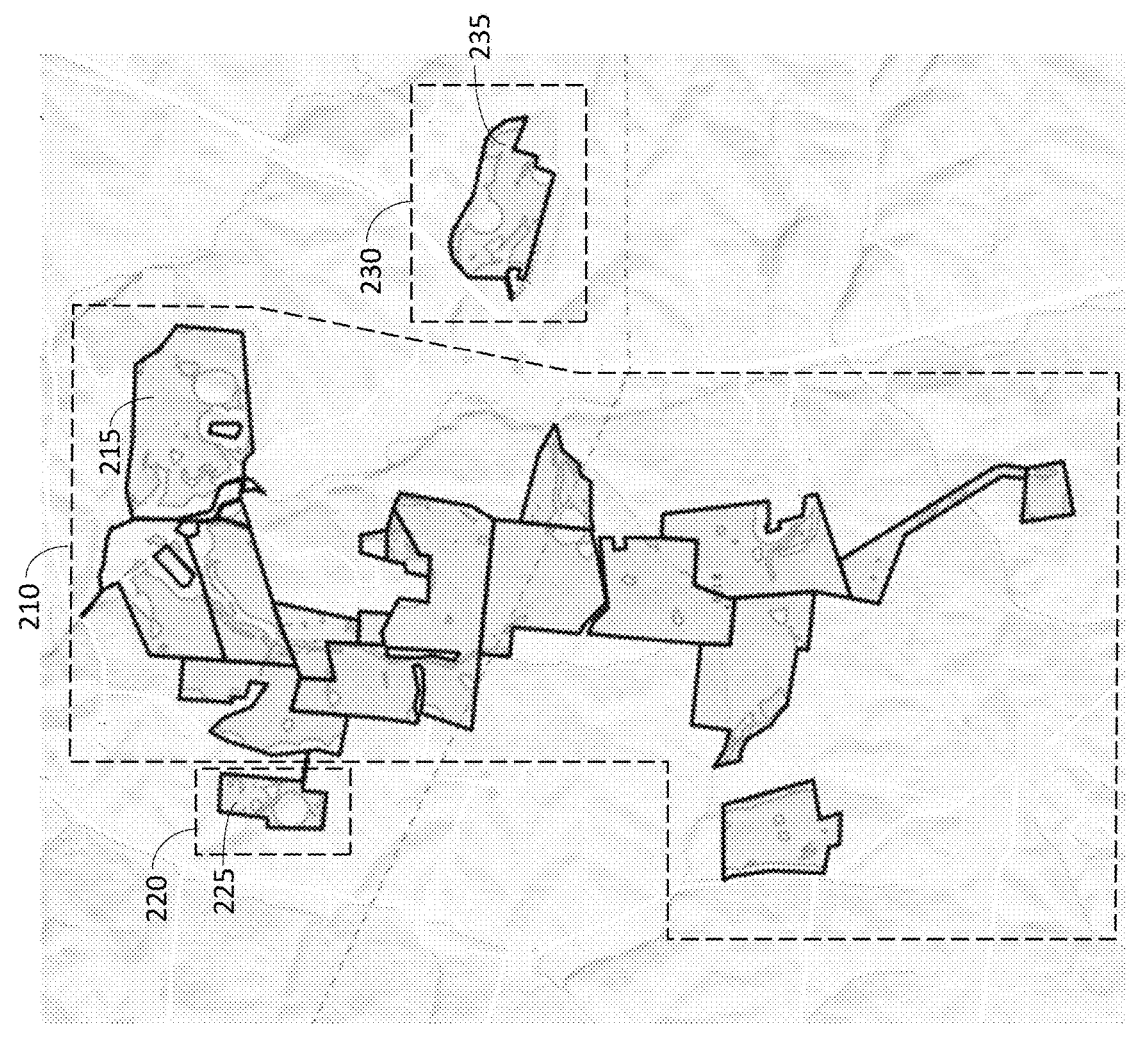
FIG. 2 illustrates an example map of a geographic area segmented into segments.

The metric generation engine 110 can segment the geographic area into one or more regions based on one or more parameters of the geographic information. In some implementations, the regions include contiguous portions of the geographic area In an example, the metric generation engine 110 segments the geographic area into parcels using ownership data and then organizes the parcels into regions by aggregating adjacent parcels into contiguous regions. In an example, the metric generation engine 110 segments the geographic area into potential sites using lease option data and then organizes the potential sites into regions by aggregating adjacent potential sites into contiguous regions. An example of a geographic area segmented into regions is illustrated in FIG. 2.

The metric generation engine 110 can execute a buildability algorithm 112 to determine buildable portions of the one or more regions of the geographic area. The metric generation engine 110 can execute the buildability algorithm 112 using as input the one or more regions. The buildable portions are areas of land on which renewable energy assets could be built. The buildability algorithm 112 can identify the buildable portions by excluding non-buildable portions of the one or more regions based on proximity to structures or roads, topography, bodies of water, rivers, streams, wetlands, and/or flood risk. In some implementations, the buildability algorithm 112 excludes the non-buildable portions of the one or more regions in stages, with each stage excluding non-buildable portions based on different criteria. In an example, the buildability algorithm 112 iteratively excludes non-buildable portions due to proximity to structures in a first stage and excludes non-buildable portions due to topography (e.g., too steep) in a second stage.

In some implementations, the metric generation engine 110 generates grading estimates corresponding to grading (i.e., leveling) of the one or more regions to increase the buildable portions. The metric generation engine 110 can generate one or more recommendations, or candidate areas, for grading. The metric generation engine 110 can generate the one or more recommendations based on an amount of grading being below a predetermined grading threshold and/or based on connecting buildable portions that are separated by non-buildable portions. In an example, the metric generation engine 110 indicates that a non-buildable portion could be converted into a buildable portion by performing an amount of grading that is below the predetermined grading threshold. In this example, the metric generation engine 110, either automatically or based on user input, modifies the non-buildable portion to convert it to a buildable portion. In an example, the metric generation engine 110 indicates that two buildable portions could be joined by grading an intervening non-buildable portion, and the metric generation engine 110 modifies the non-buildable portion to be a buildable portion. In an example, the metric generation engine 110 indicates that a non-buildable portion that is surrounded by a buildable portion could be modified to be a buildable portion by performing an amount of grading that is below the predetermined grading threshold, and the metric generation engine 110 modifies the non-buildable portion to be a buildable portion.

Figure 3:
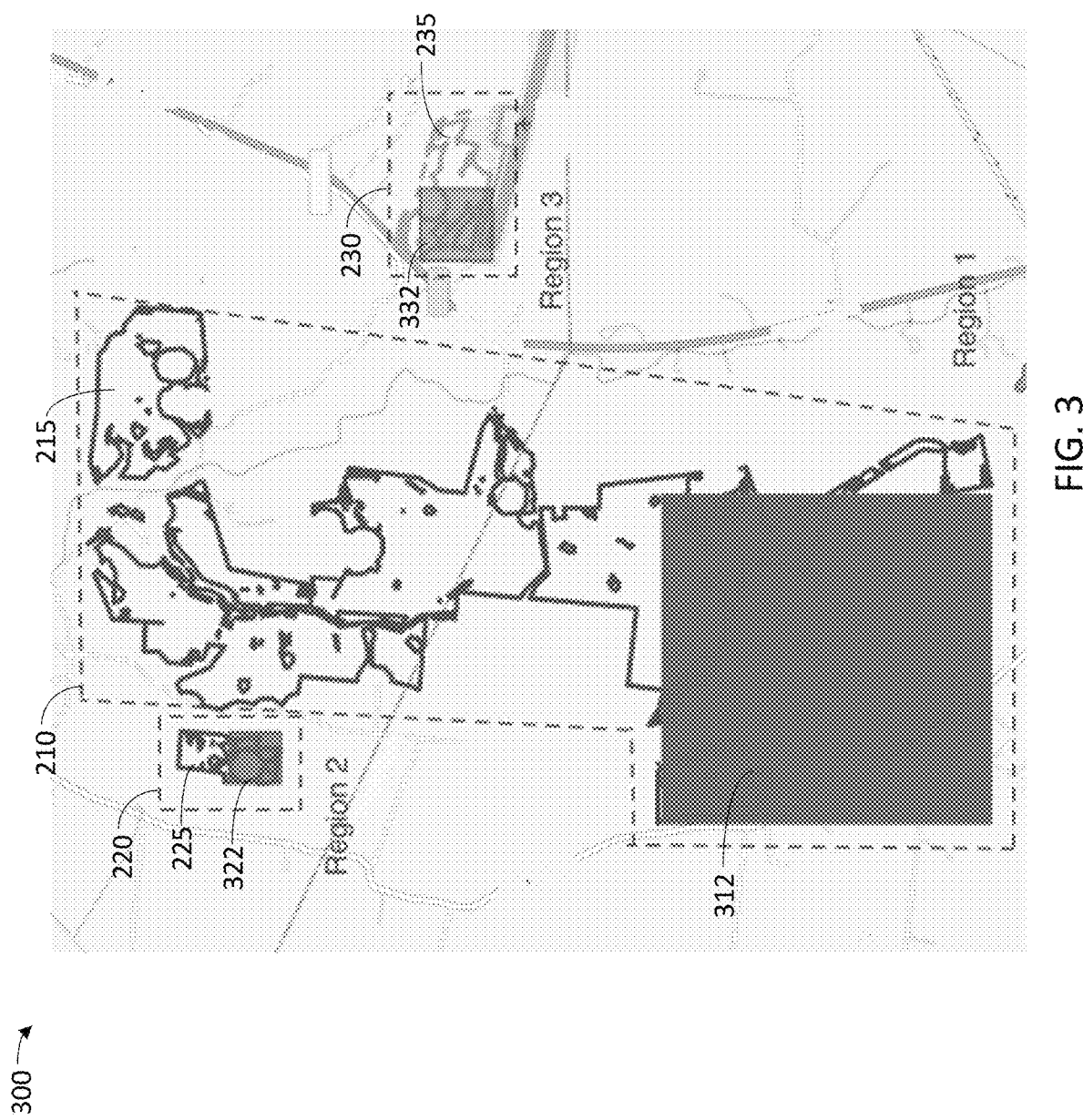
FIG. 3 illustrates an example map of the geographic area of FIG. 2 including a shape representing a total area of a buildable portion of a region.
Figure 4:
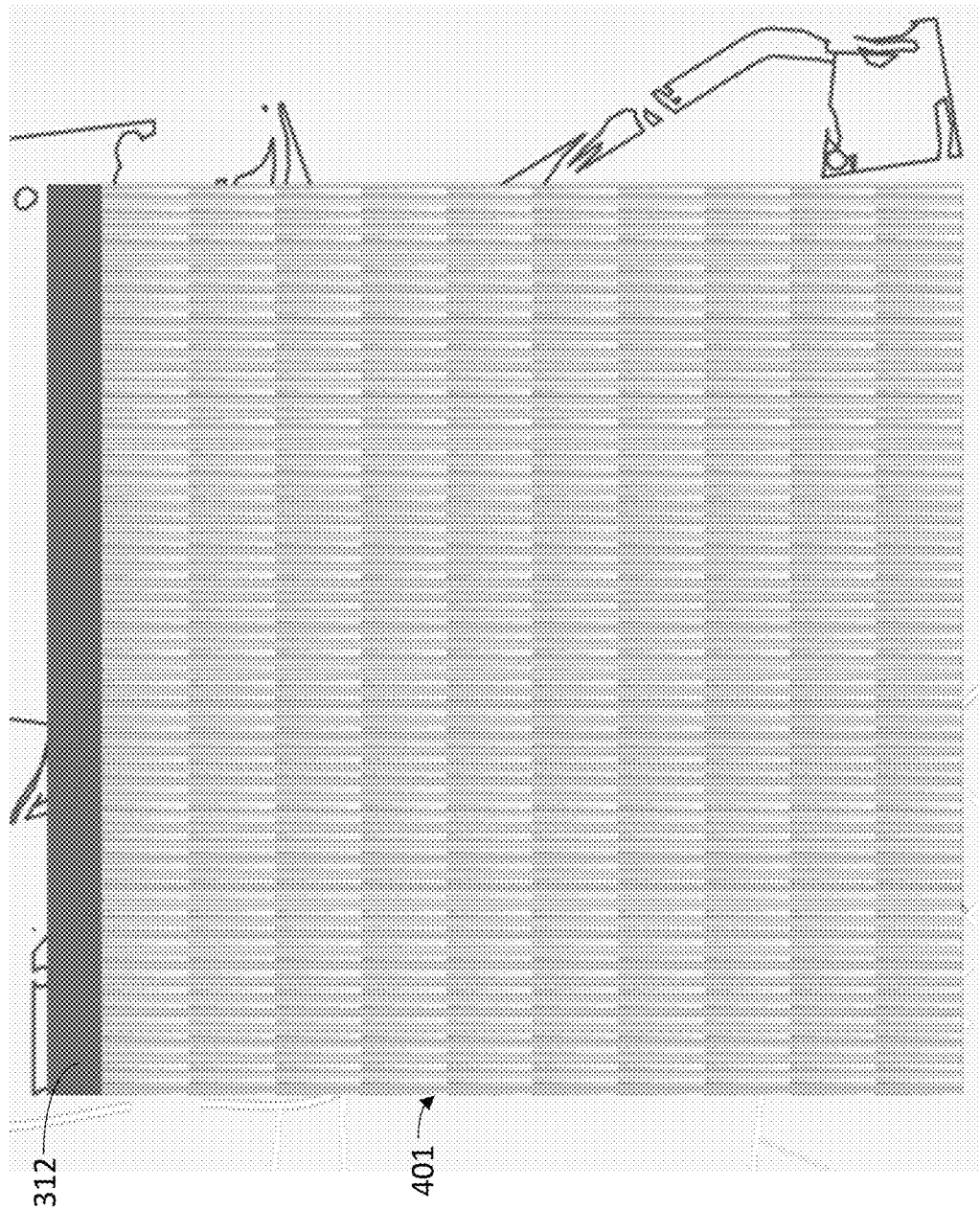
FIG. 4 illustrates an output of a PV array placement algorithm executed using as input the shape of FIG. 3.

The metric generation engine 110 can generate (e.g., determine dimensions of) a shape using the total area of the buildable portions of the one or more regions. In an example, the metric generation engine 110 generates a square or rectangle having an area equal to the total are of the buildable portions. The metric generation engine 110 can execute a PV array placement algorithm 114 using as input the generated shape to determine a baseline power generation capacity for the one or more regions. The PV array placement algorithm 114 can simulate the placement of PV arrays within the generated shape, where the expected output of the PV arrays within the generated shape corresponds to the baseline power generation capacity. The PV array placement algorithm 114 takes into account the size and shape of PV arrays in simulating the placement of the PV arrays within the generated shape. In this way, the PV array placement algorithm 114 refines the determination of buildability with usability, indicating where within the buildable portion PV arrays could actually be built, or what areas of the buildable portions are usable for installation of PV arrays. An example of a generated shape for a region is illustrated in FIG. 3, with an example of the generated shape filled with inverter blocks is illustrated in FIG. 4.

In some implementations, the PV array placement algorithm 114 places inverter blocks within the generated shape. Each inverter block can include an inverter and a plurality of PV modules. In some implementations, one or more of the inverter blocks has a DC output capacity equal to a DC capacity on the respective inverter. In this way, a number of PV modules per inverter can be maximized within the inverter blocks. In some implementations, the number of PV modules per inverter depends on a placement of each inverter block. In an example, an inverter block that is placed near an edge of a buildable portion can have a lower number of PV modules than an adjacent inverter block. In this way, the number of PV modules within the inverter blocks can be modified to increase a number of PV modules within the buildable portion. In some implementations, the PV array placement algorithm 114 places the inverter blocks to maximize an amount of space occupied by the inverter blocks within the building portions. In some implementations, the PV array placement algorithm 114 places the inverter blocks to maximize an amount of space occupied by the inverter blocks within the building portions within a set of rules or constraints. The PV array placement algorithm 114 can implement maximum (e.g., DC capacity on the inverter) and minimum rules for numbers of PV modules per inverter. The DC capacity on each inverter can have a range based on DC capacities corresponding to a maximum number of inverters and a minimum number of inverters. In an example, each inverter block can include a minimum of ten PV modules. In some implementations, the PV array placement algorithm 114 places as many maximally-sized inverter blocks as possible before placing smaller inverter blocks to increase an efficiency or capacity use of each inverter.

The PV array placement algorithm 114 can implement a set of predefined rules or constraints for placement of the PV arrays, including direction of PV arrays, string length, service road allotment, and other rules. In an example, a rule for the direction of the PV arrays can indicate that the PV arrays face west or south. In an example, a rule or constraint for service road allotment can indicate that the PV arrays be placed to allow for (allot space for) service roads between the service blocks, as well as minimum dimensions for service roads. In some implementations, the inverter blocks have a predetermined average inverter load ratio (ILR), where the average inverter load ratio is an average of the ILRs of the inverter blocks. In this way, the PV array placement algorithm 114 can place inverter blocks of various sizes according to the constraint that the overall average ILR of all of the inverter blocks is equal (±5%) to the predetermined average ILR. The set of rules or constraints can reflect design considerations, construction considerations, and/or power generation considerations for the renewable energy project. The set of rules can be modified based on user input to reflect priorities for the renewable energy project.

As noted above, the generated shape can be a rectangle or square having an area equal to the total area of the buildable portion. In an example, the generated shape is a square. However, a square may reduce an amount of PV arrays that can be placed within the generated shape. In some implementations, the generated shape is an idealized shape, the dimensions of which allow for maximal placement of PV arrays, or placement of a maximum number of PV arrays. In an example, the metric generation engine 110 generates a rectangle having a height equal to a length of an inverter block, such that inverter blocks can be lined up next to one another for an entire length of the rectangle. In an example, the metric generation engine 110 generates a rectangle having a length equal to a width of two inverter blocks with a service road between them such that pairs of inverter blocks can be stacked on top of each other for an entire height of the rectangle. In some implementations, the metric generation engine 110 iteratively generates shapes and executes the PV array placement algorithm 114 using the generated shapes to determine a shape that provides for maximal placement of PV arrays.

The PV array placement algorithm 114 can be any type of algorithm, such as a genetic algorithm or particle swarm optimization. In an example, the PV array placement algorithm 114 generates an initial scenario population of pseudo-random placements of PV arrays within the buildable portions, explores several scenarios in parallel, and ranks, mutates, and cross-links the scenarios in an iterative process until an optimal or pseudo-optimal solution is found. In some implementations, the optimal or pseudo-optimal solution is based on an estimated DC output of the placed PV arrays, where the estimated DC output is generated based on a simulation of solar irradiance of the one or more regions.

Once the PV array placement algorithm 114 has placed the PV arrays within the buildable portions, the metric generation engine 110 generates an estimated DC output for the PV arrays, corresponding to a baseline PV capacity for the one or more regions. In some implementations, the estimated DC output is generated based on an average solar irradiance for the one or more regions. In some implementations, the estimated DC output is generated based on a default, baseline amount of solar irradiance.

Figure 5:
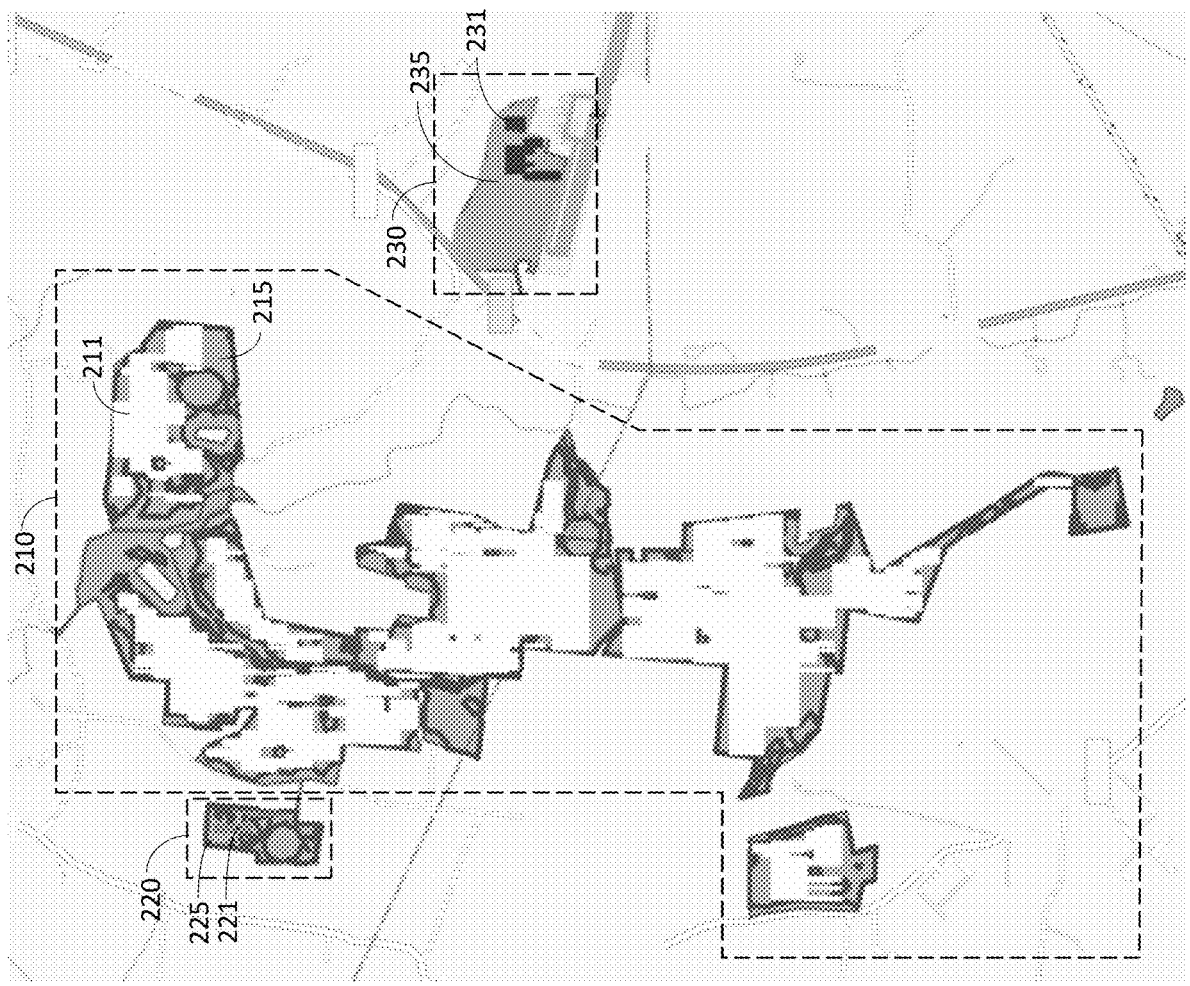
FIG. 5 illustrates an example map of the geographic area of FIG. 2, including PV arrays placed using a PV array placement algorithm.

The metric generation engine 110 executes the PV array placement algorithm 114 using as input the buildable portions of the one or more regions to determine an actual PV capacity for the one or more regions. Executing the PV array placement algorithm 114 using as input the actual buildable portions instead of the generated shape based on the total area of the buildable portions means that the PV array placement algorithm 114 is constrained by the geometry of the buildable portions. The PV array placement algorithm 114 is executed using the same settings, sets of rules, and parameters as when the PV array placement algorithm 114 was executed using as input the generated shape in order to provide a comparison between the baseline PV capacity to the actual PV capacity for the one or more regions. In this way, executing the PV array placement algorithm 114 using as input the buildable portions captures the limitations on PV array placement due to the geometry of the buildable portions. In an example, narrow strips of land included in the buildable portions may not be large enough for placement of PV arrays, meaning that the PV array placement algorithm 114 is unable to place PV arrays in the narrow strips land. In an example, non-buildable portions between buildable portions can limit the placement of PV arrays by requiring separate inverter blocks in the separated buildable portions. An example of PV arrays placed within the buildable portions is illustrated in FIG. 5.

The metric generation engine 110 calculates a ratio between the baseline PV capacity to the actual PV capacity for the one or more regions. In an example, the metric generation engine 110 calculates the ratio for each of the one or more regions. The metric generation engine 110 generates a data structure to associate the one or more regions with the respective ratio for each region. The metric generation engine 110 stores the generated data structure in the metrics database 130. In some implementations, the ratio is represented in the data structure as a percentage. The ratio can represent a land usability metric. The metrics database 130 can store a buildability metric and a land usability metric for each region, where the buildability metric indicates how much of the region is buildable, and the usability metric indicates how much of the buildable portion of the region is usable. In some implementations, the usability metric includes a total usable area of the region. In some implementations, the generated data structure includes a map including the one or more regions and labels indicating the ratio of the baseline PV capacity to the actual PV capacity for each region. In an example, the generated data structure is a map showing the regions, where selecting or hovering over a region brings up the buildability and usability metrics for the region. Generating the generated data structure allows for automated evaluation of potential sites for renewable energy projects. A user can sort potential sites by the buildability and/or usability metrics to identify potential sites in regions with high buildability and/or usability. In this way, hundreds of thousands of potential sites can be automatically evaluated, far beyond the capacity of the human mind, even with the aid of tools such as pencil and paper.

FIG. 2 illustrates an example map 200 of a geographic area segmented into region. The map 200 includes a first region 210, a second region 220, and a third region 230. The first region 210 includes a plurality of parcels that are aggregated to form the first region 210. In some implementations, the first region 210 is formed or defined by aggregating a plurality of adjacent parcels. The first region 210 includes a first buildable portion 215. The first buildable portion 215 of the first region 210 represents a portion of the first region 210 on which assets (e.g., renewable energy assets, roads, transmission lines, etc.) could be built. In some implementations, the first buildable portion 215 includes a plurality of separate portions within the first region 210. As shown in FIG. 2, the first buildable portion 215 is less than a total area of the parcels of the first region 210. The first buildable portion 215 can be generated using setback rules defining setbacks from roads and structure. In an example, the first buildable portion 215 includes roughly circular exclusions representing setbacks from structures.

The second region 220 includes a second buildable portion 225 and the third region 230 includes a third buildable portion 235. In some implementations, the first buildable portion 215, the second buildable portion 225, and the third buildable portion 235 are determined using the buildability algorithm 112 of FIG. 1.

FIG. 3 illustrates an example map 300 of the geographic area of FIG. 2 including shapes representing a total area of a buildable portions of regions. The map 300 includes the first region 210, the second region 220, and the third region 230. The map 300 includes the first buildable portion 215, the second buildable portion 225, and the third buildable portion 235. The map 300 does not include parcel boundaries as shown in the map 200 of FIG. 2.

The map 300 includes a first shape 312 corresponding to a total area of the first buildable portion 215. The first shape 312 has an area equal to the total area of the first buildable portion 215. In some implementations, the first shape 312 is, as illustrated, a square having an area equal to the total area of the first buildable portion 215. The first shape 312 can be any shape having an area equal to the total area of the first buildable portion 215. In some implementations, the first shape 312 is generated to allow for maximal placement of PV arrays within the first shape 312. The map includes a second shape 322 corresponding to a total area of the second buildable portion 225 and a third shape 335 corresponding to a total area of the third buildable portion 235. Similar to the first shape 312, the second shape 322 and the third shape 332 are shown as squares, but can be any shape, such as a shape generated for maximal placement of PV arrays. In some implementations, the first shape 312, the second shape 322, and the third shape 332 are generated by the metric generation engine 110 of FIG. 1.

FIG. 4 illustrates an output of a PV array placement algorithm executed using as input the first shape 312 of FIG. 3. In some implementations, the PV array placement algorithm is the PV array placement algorithm 114 of FIG. 1. The first shape 312 includes inverter blocks 401 placed by the PV array placement algorithm. The inverter blocks 401 include an inverter and associated (e.g., connected) PV arrays. As shown, the inverter blocks 401 are tightly packed in the first shape 312, as the square geometry of the first shape 312 imposes few restrictions on the placement of the inverter blocks 401. However, as shown, the first shape 312 includes a top portion that is not covered by the inverter blocks 401, indicating that the first shape 312 is not an idealized, optimized shape for PV array placement.

FIG. 5 illustrates an example map 500 of the geographic area of FIG. 2, including PV arrays placed using a PV array placement algorithm. The map 500 includes the first region 210, the second region 220, and the third region 230. The map 500 includes the first buildable portion 215, the second buildable portion 225, and the third buildable portion 235. The map 500 does not include parcel boundaries as shown in the map 200 of FIG. 2.

The map 500 includes first inverter blocks 211 placed within the first buildable portion 215 of the first region 210. The first inverter blocks 211 were placed within the first buildable portion 215 using the same PV array placement algorithm used to place the inverter blocks 401 of FIG. 4. The placement of the first inverter blocks 211 is constrained by the geometry of the first buildable portion 215. In an example, the first inverter blocks 211 are not placed in areas within the first buildable portion 215 that are separated by non-buildable portions of the first region 210. In an example, the first inverter blocks 211 are not placed in areas within the first buildable portion 215 that are too narrow for placement of inverter blocks.

The map 500 includes second inverter blocks 221 placed within the second buildable portion 225 of the second region 220 and third inverter blocks 231 placed within the third buildable portion 235 of the third region 230. The second inverter blocks 221 and the third inverter blocks 231 are placed by the same PV array placement algorithm used to place the inverter blocks 401 of FIG. 4.

An expected output, or PV capacity of the first inverter blocks 211 can be calculated and compared to an expected output, or PV capacity of the inverter blocks 401 of FIG. 4. The PV capacity of the inverter blocks 401 of FIG. 4 can be referred to as a baseline capacity of the first region 210 and the PV capacity of the first inverter blocks 201 can be referred to as an actual capacity of the first region 210. A ratio of the PV capacity of the first inverter blocks 201 and the inverter blocks 401 of FIG. 4 can be used as a land usability metric of the first region 210, indicating what portion of the first region 210 is usable for a renewable energy project, or for power generation using PV arrays. A similar ratio can be calculated for the second region 220 using a PV capacity of the second inverter blocks 221 and a PV capacity of inverter blocks placed in the second shape 322. A similar ratio can be calculated for the third region 230 using a PV capacity of the third inverter blocks 231 and a PV capacity of inverter blocks placed in the third shape 332.

Figure 6:
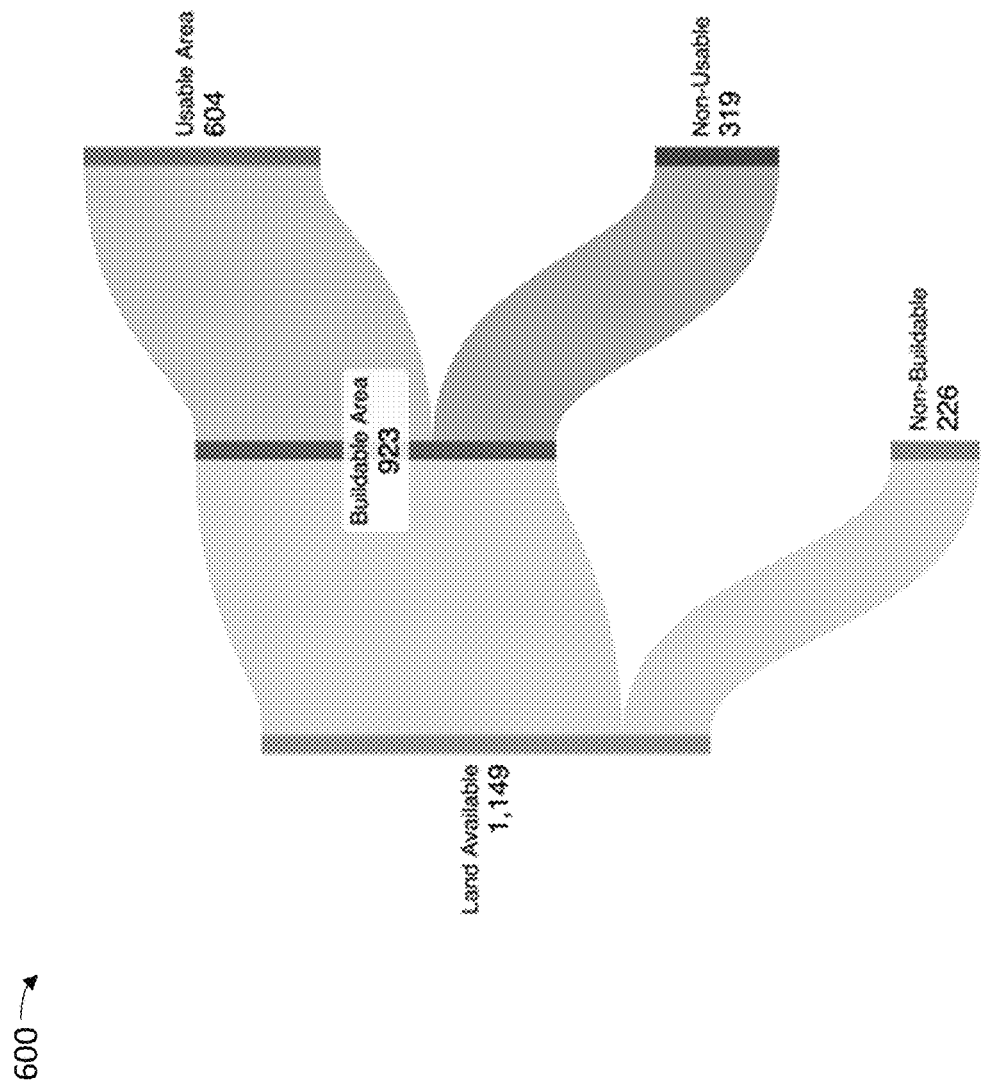
FIG. 6 is an example chart illustrating a comparison of usable land to a total land area.

FIG. 6 is an example chart 600 illustrating a comparison of usable land to a total land area. The chart 600 can correspond to the first region 210 of FIG. 2, displaying numerical values for the total area of the first region 210, the first buildable portion 215, and the first inverter blocks 201.

The chart 600 shows how total land available or a region is reduced by removing non-buildable land and then how the buildable land is reduced by removing non-usable land to give usable area. In some implementations, the chart 600 includes areas for each category of land. In an example, 1,149 acres are available in a region, with 923 acres of buildable area and 226 acres of non-buildable are 226, where 604 acres are usable land, with 319 acres of the buildable are being non-usable. In some implementations, the chart 600 shows how expected PV output, or PV capacity of a region is reduced by removing the PV capacity of non-buildable land and then how the PV capacity of the buildable land is reduced by removing the PV capacity of non-usable land to give the PV capacity of the remaining usable area. In an example, the PV capacity of the region is 1,149 MWh, with 226 MWh of PV capacity subtracted due to non-buildable area to give 923 MWh of capacity on the buildable area, with 319 MWh of capacity subtracted due to non-usable area to give 604 MWh of PV capacity for the usable portion of the region.

Figure 7:
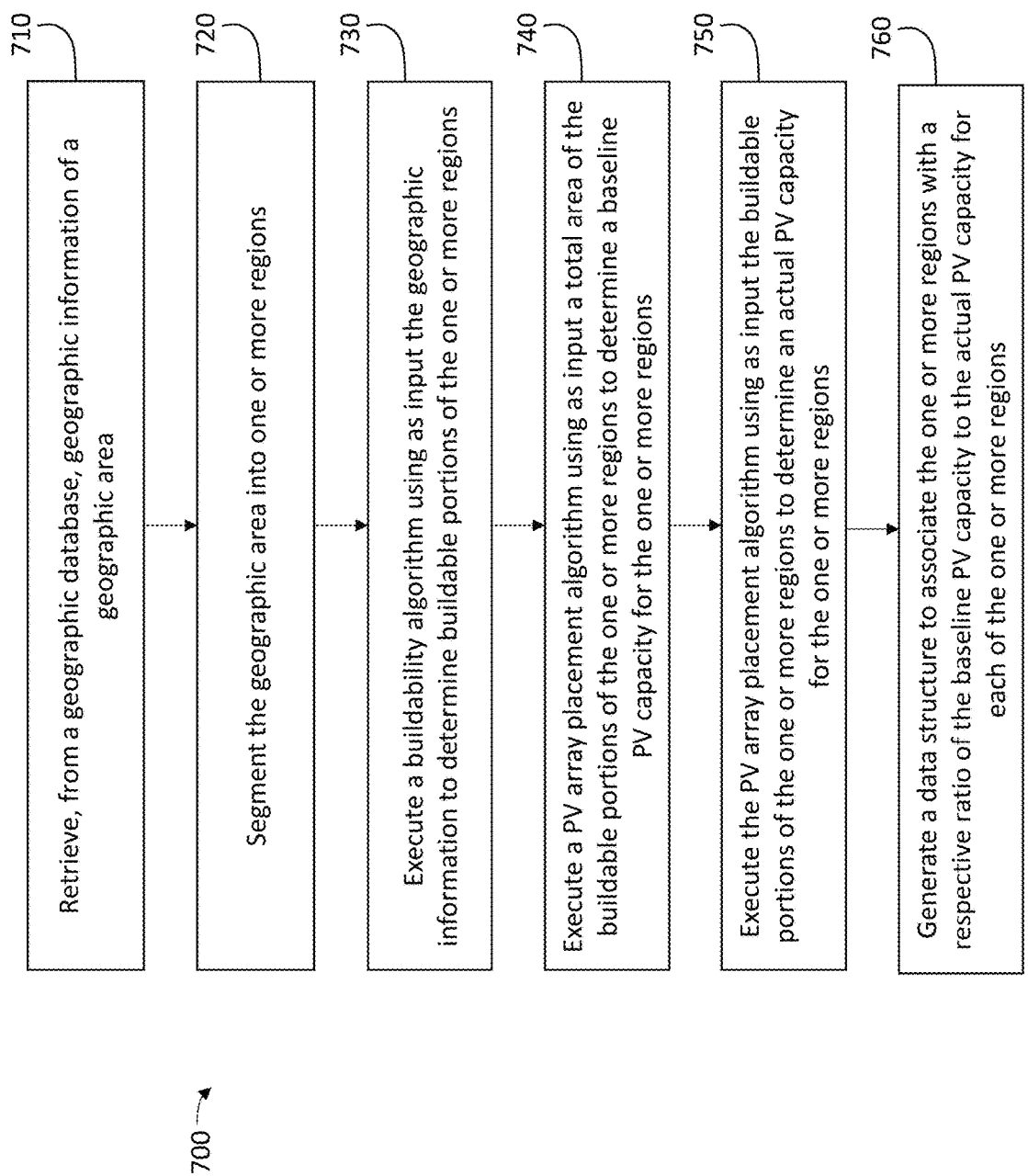
FIG. 7 is a flowchart illustrating operations of an example method for generating land usability metrics.

FIG. 7 is a flowchart illustrating operations of an example method 700 for generating land usability metrics. The method 700 may be performed by the system 100 of FIG. 1. The method 700 may be performed by the metric generation engine 110 of FIG. 1. The method 700 can include more, fewer, or different operations than shown. The operations can be performed in the order shown, in a different order, or concurrently.

At operation 710, geographic information of a geographic area is retrieved from a geographic database. The geographic database can include a plurality of databases and/or aggregate geographic data from a plurality of databases. The geographic information can include spatial data, attribute data and/or metadata. The geographic information can include topography, precipitation, solar irradiance, flood risk, soil composition, and other data.

At operation 720, the geographic area is segmented into one or more regions. The geographic area can be segmented into contiguous regions. The geographic area can be segmented into regions including adjacent parcels of land.

At operation 730, a buildability algorithm is executed using as input the geographic information to determine buildable portions of the one or more regions. The buildability algorithm can include predetermined thresholds for slope, flood risk, and other land characteristics. The buildability algorithm can exclude portions of the one or more regions that exceed the predetermined thresholds.

At operation 740, a PV array placement algorithm is executed using as input a total area of the buildable portions of the one or more regions to determine an actual PV capacity for the one or more regions. In some implementations, executing the PV array placement algorithm using as input the total area of the buildable portions of the one or more regions includes generating a shape having an area equal to the total are of the buildable portions of the regions and executing the PV array placement algorithm using as input the generated shape. In some implementations, the shape is a rectangle having an area equal to the total area of the buildable portions of the one or more regions.

At operation 750, the PV array placement algorithm is executed using as input the buildable portions of the one or more regions to determine an actual PV capacity for the one or more regions. In some implementations, the PV array placement algorithm places inverter blocks each including an inverter and a plurality of PV modules within the buildable portions of the one or more regions. In some implementations, the plurality of PV modules for an inverter block of the inverter blocks have a DC output capacity equal to a DC capacity on the inverter for the inverter block. In some implementations, a number of the plurality of PV modules for an inverter block of the inverter blocks is determined based on a placement of the inverter block.

In some implementations, the PV array placement algorithm places the inverter blocks to maximize an amount of space occupied by the inverter blocks within the buildable portions of the one or more regions. In some implementations, the PV array placement algorithm places the inverter blocks to allow for service roads between the inverter blocks. In some implementations, the PV array placement algorithm places the inverter blocks to maximize the amount of space occupied by the inverter blocks within the buildable portions within a set of rules or constraints such as allowing for service roads between the inverter blocks.

At operation 760, a data structure is generated to associate the one or more regions with a respective ratio of the baseline PV capacity to the actual PV capacity for each of the one or more regions. In some implementations, the generated data structure includes a map including the one or more regions. The map can include labels indicating the ratio of the baseline PV capacity to the actual PV capacity for each of the one or more regions.

The foregoing detailed description includes illustrative examples of various aspects and implementations and provides an overview or framework for understanding the nature and character of the claimed aspects and implementations. The drawings provide illustration and a further understanding of the various aspects and implementations and are incorporated in and constitute a part of this specification.

The subject matter and the operations described in this specification can be implemented in digital electronic circuitry, or in computer software, firmware, or hardware, including the structures disclosed in this specification and their structural equivalents, or in combinations of one or more of them. The subject matter described in this specification can be implemented as one or more computer programs, e.g., one or more circuits of computer program instructions, encoded on one or more computer storage media for execution by, or to control the operation of, data processing apparatuses. A computer storage medium can be, or be included in, a computer-readable storage device, a computer-readable storage substrate, a random or serial access memory array or device, or a combination of one or more of them. While a computer storage medium is not a propagated signal, a computer storage medium can be a source or destination of computer program instructions encoded in an artificially generated propagated signal. The computer storage medium can also be, or be included in, one or more separate components or media (e.g., multiple CDs, disks, or other storage devices). The operations described in this specification can be implemented as operations performed by a data processing apparatus on data stored on one or more computer-readable storage devices or received from other sources.

The terms "computing device" or "component" encompass various apparatuses, devices, and machines for processing data, including by way of example a programmable processor, a computer, a system on a chip, or multiple ones, or combinations of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a model stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, app, script, or code) can be written in any form of programming language, including compiled or interpreted languages, declarative or procedural languages, and can be deployed in any form, including as a stand-alone program or as a module, component, subroutine, object, or other unit suitable for use in a computing environment. A computer program can correspond to a file in a file system. A computer program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating an output. The processes and logic flows can also be performed by, and apparatuses can also be implemented as, special purpose logic circuitry, e.g., an FPGA (field programmable gate array) or an ASIC (application specific integrated circuit). Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks. The processor and the memory can be supplemented by, or incorporated in, special purpose logic circuitry.

While operations are depicted in the drawings in a particular order, such operations are not required to be performed in the particular order shown or in sequential order, and all illustrated operations are not required to be performed. Actions described herein can be performed in a different order. The separation of various system components does not require separation in all implementations, and the described program components can be included in a single hardware or software product.

The phraseology and terminology used herein is for the purpose of description and should not be regarded as limiting. Any references to implementations or elements or acts of the systems and methods herein referred to in the singular may also embrace implementations including a plurality of these elements, and any references in plural to any implementation or element or act herein may also embrace implementations including only a single element. Any implementation disclosed herein may be combined with any other implementation or embodiment.

References to "or" may be construed as inclusive so that any terms described using "or" may indicate any of a single, more than one, and all of the described terms. References to at least one of a conjunctive list of terms may be construed as an inclusive OR to indicate any of a single, more than one, and all of the described terms. For example, a reference to "at least one of 'A' and 'B'" can include only 'A', only 'B', as well as both 'A' and 'B'. Such references used in conjunction with "comprising" or other open terminology can include additional items.

The foregoing implementations are illustrative rather than limiting of the described systems and methods. Scope of the systems and methods described herein is thus indicated by the appended claims, rather than the foregoing description, and changes that come within the meaning and range of equivalency of the claims are embraced therein.

What is claimed is:

1. A method, comprising:
   retrieving, from a geographic database, geographic information of a geographic area;
   segmenting the geographic area into one or more regions;
   executing a buildability algorithm using as input the geographic information to determine buildable portions of the one or more regions;
   executing a photovoltaic (PV) array placement algorithm using as input a total area of the buildable portions of the one or more regions to determine a baseline PV capacity for the one or more regions;
   executing the PV array placement algorithm using as input the buildable portions of the one or more regions to place inverter blocks each comprising an inverter and a plurality of PV modules within the buildable portions of the one or more regions to determine an actual PV capacity for the one or more regions; and generating a data structure to associate the one or more regions with a respective ratio of the baseline PV capacity to the actual PV capacity for each of the one or more regions.

2. The method of claim 1, wherein executing the PV array placement algorithm using as input the total area of the buildable portions of the one or more regions includes:

generating a shape having an area equal to the total area of the buildable portions of the one or more regions; and executing the PV array placement algorithm using as input the generated shape.

3. The method of claim 1, wherein the plurality of PV modules for an inverter block of the inverter blocks have a DC output capacity equal to a DC capacity on the inverter for the inverter block.

4. The method of claim 3, wherein the inverter blocks have a predetermined average inverter load ratio (ILR) that is less than the DC capacity on the inverter.

5. The method of claim 3, wherein the PV array placement algorithm places the inverter blocks to maximize an amount of space occupied by the inverter blocks within the buildable portions of the one or more regions according to a set of predefined constraints.

6. The method of claim 5, wherein the set of predefined constraints includes placing the inverter blocks to allow for service roads between the inverter blocks.

7. The method of claim 1, wherein a number of the plurality of PV modules for an inverter block of the inverter blocks is determined based on a placement of the inverter block.

8. The method of claim 1, wherein the generated data structure comprises a map including the one or more regions, wherein the map includes labels indicating the ratio of the baseline PV capacity to the actual PV capacity for each of the one or more regions.

9. The method of claim 1, further comprising modifying one or more of the buildable portions based on an amount of grading below a predetermined grading threshold.

10. A non-transitory, computer-readable medium including instructions which, when executed by one or more processors, cause the one or more processors to:

retrieve, from a geographic database, geographic information of a geographic area;

segment the geographic area into one or more regions;

execute a buildability algorithm using as input the geographic information to determine buildable portions of the one or more regions;

execute a photovoltaic (PV) array placement algorithm using as input a total area of the buildable portions of the one or more regions to place inverter blocks each comprising an inverter and a plurality of PV modules within the buildable portions of the one or more regions to determine a baseline PV capacity for the one or more regions;

execute the PV array placement algorithm using as input the buildable portions of the one or more regions to determine an actual PV capacity for the one or more regions; and generate a data structure to associate the one or more regions with a respective ratio of the baseline PV capacity to the actual PV capacity for each of the one or more regions.

11. The non-transitory, computer-readable medium of claim 10, wherein the instructions cause the one or more processors to execute the PV array placement algorithm using as input the total area of the buildable portions of the one or more regions by:

generating a shape having an area equal to the total area of the buildable portions of the one or more regions; and executing the PV array placement algorithm using as input the generated shape.

12. The non-transitory, computer-readable medium of claim 10, wherein the plurality of PV modules for an inverter block of the inverter blocks have a DC output capacity equal to a DC capacity on the inverter for the inverter block.

13. The non-transitory, computer-readable medium of claim 12, wherein the inverter blocks have a predetermined average inverter load ratio (ILR) that is less than the DC capacity on the inverter.

14. The non-transitory, computer-readable medium of claim 12, wherein the PV array placement algorithm places the inverter blocks to maximize an amount of space occupied by the inverter blocks within the buildable portions of the one or more regions according to a set of predefined constraints.

15. The non-transitory, computer-readable medium of claim 14, wherein the set of predefined constraints includes placing the inverter blocks to allow for service roads between the inverter blocks.

16. The non-transitory, computer-readable medium of claim 10, wherein a number of the plurality of PV modules for an inverter block of the inverter blocks is determined based on a placement of the inverter block.

17. The non-transitory, computer-readable medium of claim 10, wherein the generated data structure comprises a map including the one or more regions, wherein the map includes labels indicating the ratio of the baseline PV capacity to the actual PV capacity for each of the one or more regions.

18. The non-transitory, computer-readable medium of claim 10, further comprising modifying one or more of the buildable portions based on an amount of grading below a predetermined grading threshold.

19. A method, comprising:

retrieving, from a geographic database, geographic information of a geographic area;

segmenting the geographic area into one or more regions;

executing a buildability algorithm using as input the geographic information to determine buildable portions of the one or more regions;

execute a photovoltaic (PV) array placement algorithm using as input a total area of the buildable portions of the one or more regions to determine a baseline PV capacity for the one or more regions;

executing the PV array placement algorithm using as input the buildable portions of the one or more regions to determine an actual PV capacity for the one or more regions; and generating a data structure comprising a map with labels indicating a respective ratio of the baseline PV capacity to the actual PV capacity for each of the one or more regions.

20. A method, comprising:

retrieving, from a geographic database, geographic information of a geographic area;

segmenting the geographic area into one or more regions;

executing a buildability algorithm using as input the geographic information to determine buildable portions of the one or more regions;

modifying one or more of the buildable portions based on an amount of grading below a predetermined grading threshold;

execute a photovoltaic (PV) array placement algorithm using as input a total area of the buildable portions of the one or more regions to determine a baseline PV capacity for the one or more regions;

executing the PV array placement algorithm using as input the buildable portions of the one or more regions to determine an actual PV capacity for the one or more regions; and generating a data structure to associate the one or more regions with a respective ratio of the baseline PV capacity to the actual PV capacity for each of the one or more regions.

* * * * *